(12) United States Patent
Krücken et al.

(10) Patent No.: US 10,221,482 B2
(45) Date of Patent: Mar. 5, 2019

(54) GAS DISTRIBUTOR FOR A CVD REACTOR

(71) Applicant: AIXTRON SE, Herzogenrath (DE)

(72) Inventors: Thomas Krücken, Aachen (DE);
Baskar Pagadala Gopi, Aachen (DE);
Martin Dauelsberg, Aachen (DE)

(73) Assignee: AIXTRON SE, Herzogenrath (DE)

( * ) Notice: Subject to any disclaimer, the term of this patent is extended or adjusted under 35 U.S.C. 154(b) by 1035 days.

(21) Appl. No.: 14/180,853

(22) Filed: Feb. 14, 2014

(65) Prior Publication Data
US 2014/0231550 A1 Aug. 21, 2014

(30) Foreign Application Priority Data

Feb. 15, 2013 (DE) .................. 10 2013 101 534

(51) Int. Cl.
*C23C 16/455* (2006.01)

(52) U.S. Cl.
CPC .. *C23C 16/45561* (2013.01); *C23C 16/45565* (2013.01); *C23C 16/45574* (2013.01)

(58) Field of Classification Search
USPC ....................................................... 118/715
See application file for complete search history.

(56) References Cited

U.S. PATENT DOCUMENTS

| | | | |
|---|---|---|---|
| 3,381,114 A | * | 4/1968 | Nakanuma .............. C30B 25/14 118/725 |
| 5,453,124 A | | 9/1995 | Moslehi et al. |
| 5,595,606 A | * | 1/1997 | Fujikawa .......... C23C 16/45561 118/715 |
| 5,871,586 A | | 2/1999 | Crawley et al. |

(Continued)

FOREIGN PATENT DOCUMENTS

| | | |
|---|---|---|
| DE | 102005004312 A1 | 8/2006 |
| DE | 102009000903 A1 | 5/2010 |
| EP | 0687749 A1 | 12/1995 |

OTHER PUBLICATIONS

International Search Report dated Jun. 1, 2006, from the European Patent Office, for International Application No. PCT/EP2006/050049 (filed Jan. 5, 2006), 4 pages.

(Continued)

*Primary Examiner* — Gordon Baldwin
*Assistant Examiner* — Mirza Israr Javed
(74) *Attorney, Agent, or Firm* — Ascenda Law Group, PC

(57) ABSTRACT

A gas distributor for a CVD reactor includes two separate gas distribution chambers, into each of which a process gas can be fed through an infeed opening. Each of the gas distribution chambers is formed, in part, by a gas distribution device disposed in a top layer being in each case flow-connected to connecting channels disposed in a bottom layer. The connecting channels associated with different gas distribution chambers lie alternately adjacent to one another and have gas outlet openings for the process gases to escape. Each of the at least two gas distribution devices has a distribution section, which in each case is flow-connected to a plurality of sub-distribution sections. The connecting channels are flow-connected to at least one of the sub-distribution sections. The sub-distribution sections of different gas distribution chambers lie alternately adjacent to one another and are separated from one another by a dividing wall.

10 Claims, 18 Drawing Sheets

(56) References Cited

U.S. PATENT DOCUMENTS

| | | | |
|---|---|---|---|
| 6,206,972 B1* | 3/2001 | Dunham | C23C 16/45565 118/715 |
| 6,245,192 B1 | 6/2001 | Dhindsa et al. | |
| 6,436,193 B1 | 8/2002 | Kasai et al. | |
| 6,444,042 B1* | 9/2002 | Yang | C23C 16/45565 118/715 |
| 6,800,139 B1 | 10/2004 | Shinriki et al. | |
| 6,921,437 B1 | 7/2005 | DeDontney et al. | |
| 7,481,886 B2 | 1/2009 | Kato et al. | |
| 7,537,662 B2* | 5/2009 | Soininen | C23C 16/4412 118/715 |
| 7,601,223 B2* | 10/2009 | Lindfors | C23C 16/4412 118/715 |
| 9,057,128 B2* | 6/2015 | Olgado | C23C 16/45565 |
| 2002/0059904 A1 | 5/2002 | Doppelhammer | |
| 2003/0207032 A1 | 11/2003 | Ahn et al. | |
| 2004/0103844 A1 | 6/2004 | Chou et al. | |
| 2004/0149212 A1 | 8/2004 | Cho et al. | |
| 2005/0109280 A1* | 5/2005 | Chen | B82Y 30/00 118/724 |
| 2005/0217580 A1* | 10/2005 | DeDontney | C23C 16/45574 118/715 |
| 2009/0013930 A1* | 1/2009 | Reinhold | C23C 16/45574 118/715 |
| 2009/0098276 A1* | 4/2009 | Burrows | C23C 16/45565 427/8 |
| 2010/0126418 A1* | 5/2010 | Chiang | C23C 16/45559 118/715 |
| 2011/0073038 A1* | 3/2011 | Chien | C23C 16/45565 118/715 |
| 2011/0293832 A1* | 12/2011 | Gersdorff | B05D 1/60 427/255.28 |

OTHER PUBLICATIONS

International Preliminary Report on Patentability dated Jul. 31, 2007, from The International Bureau of WIPO, for International Application No. PCT/EP2006/050049 (filed Jan. 5, 2006), 7 pages.

Office Action dated Jan. 22, 2008, from the European Patent Office, for European Application No. 06707668.7, 4 pages.

Reply to EP Office Action dated Jun. 5, 2008, for European Application No. 06707668.7, 21 pages.

* cited by examiner

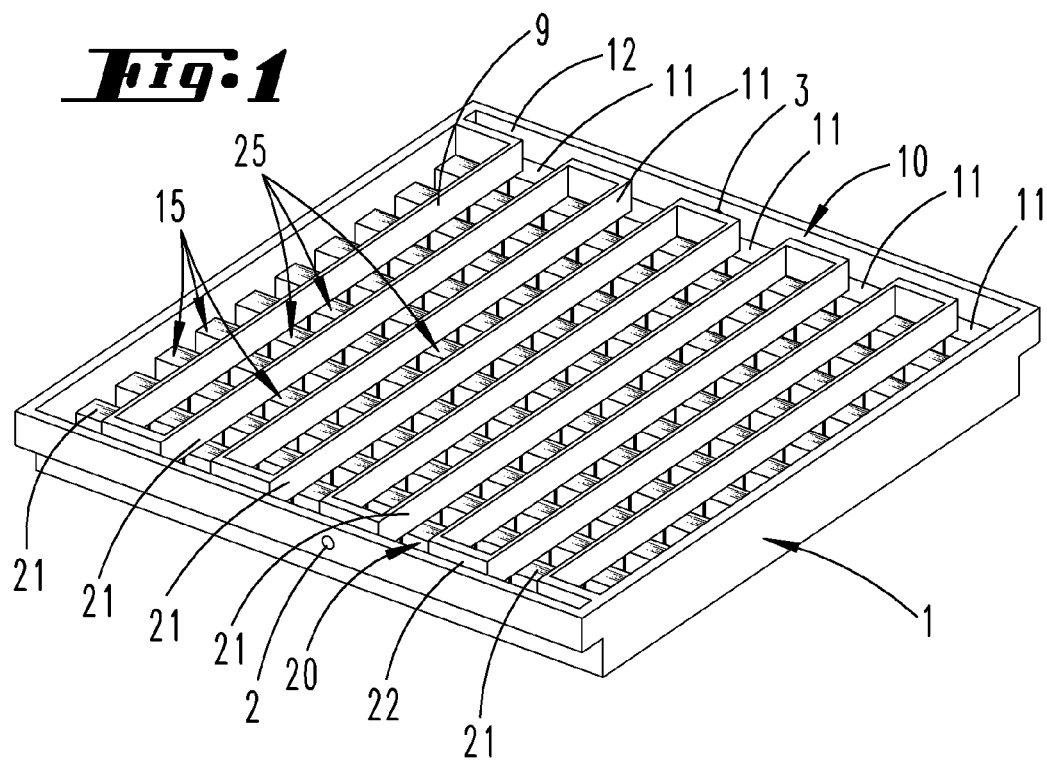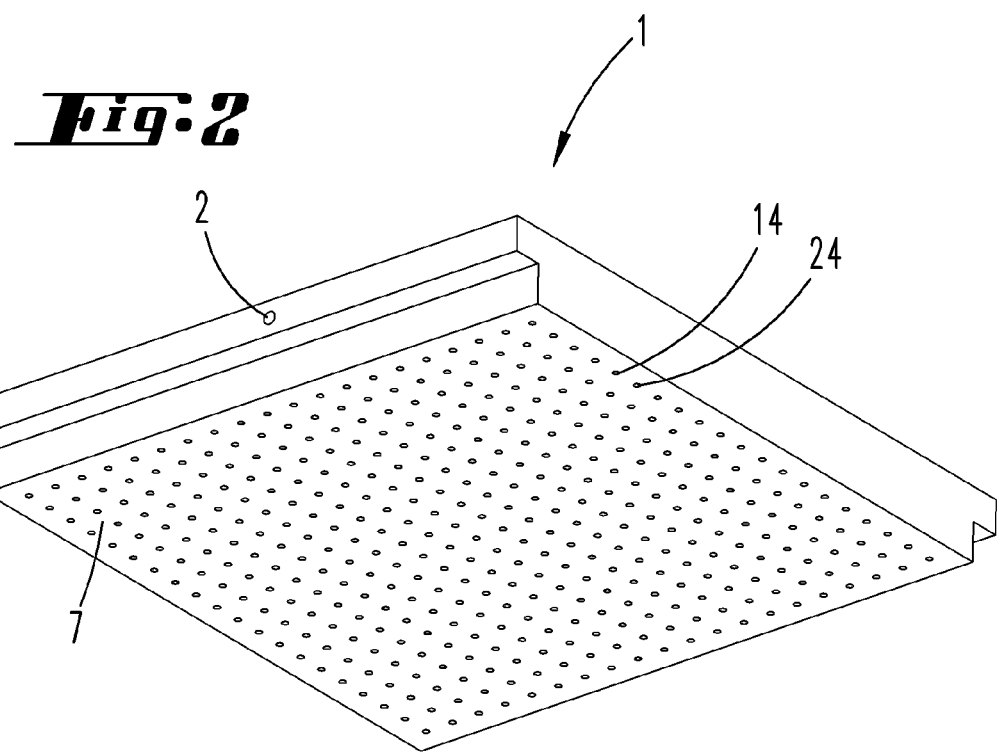

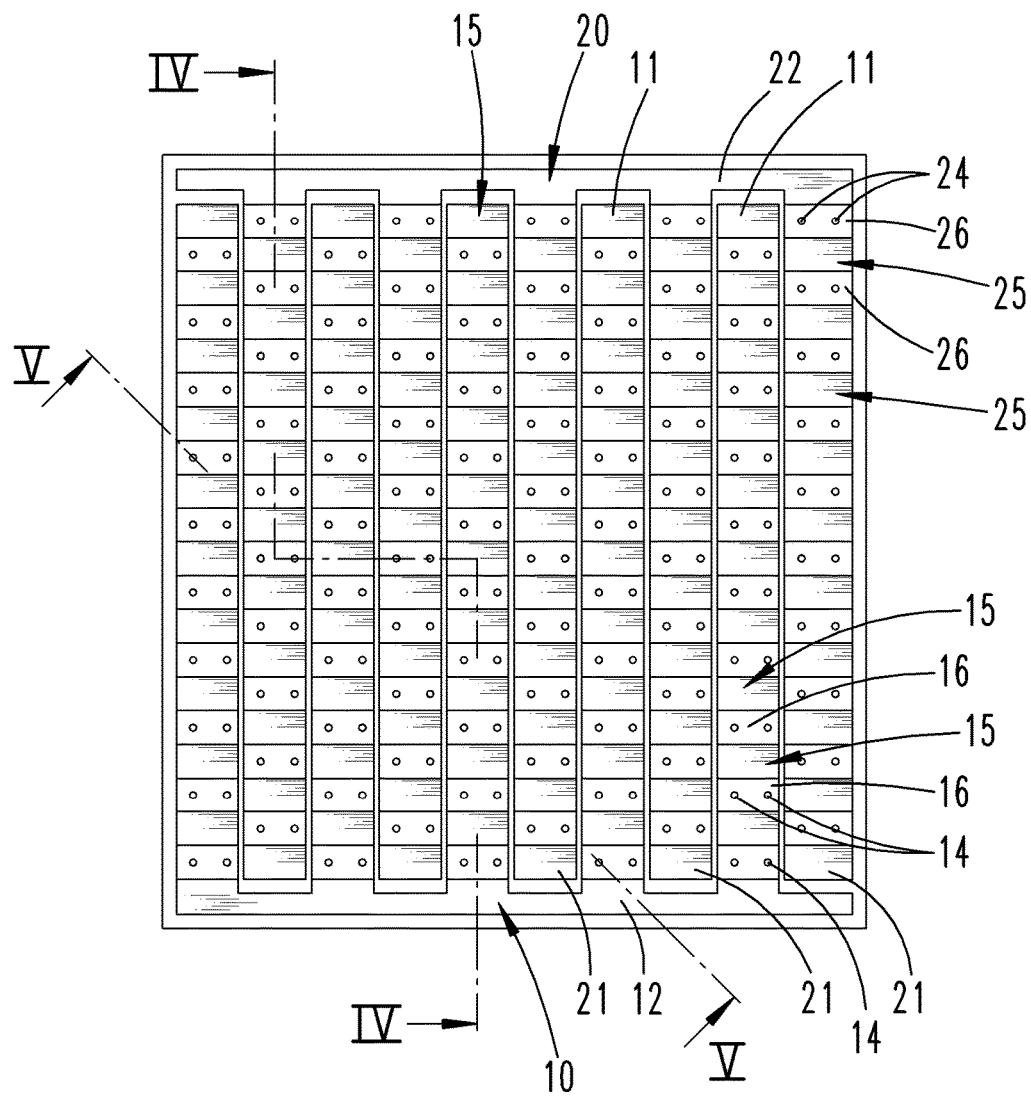

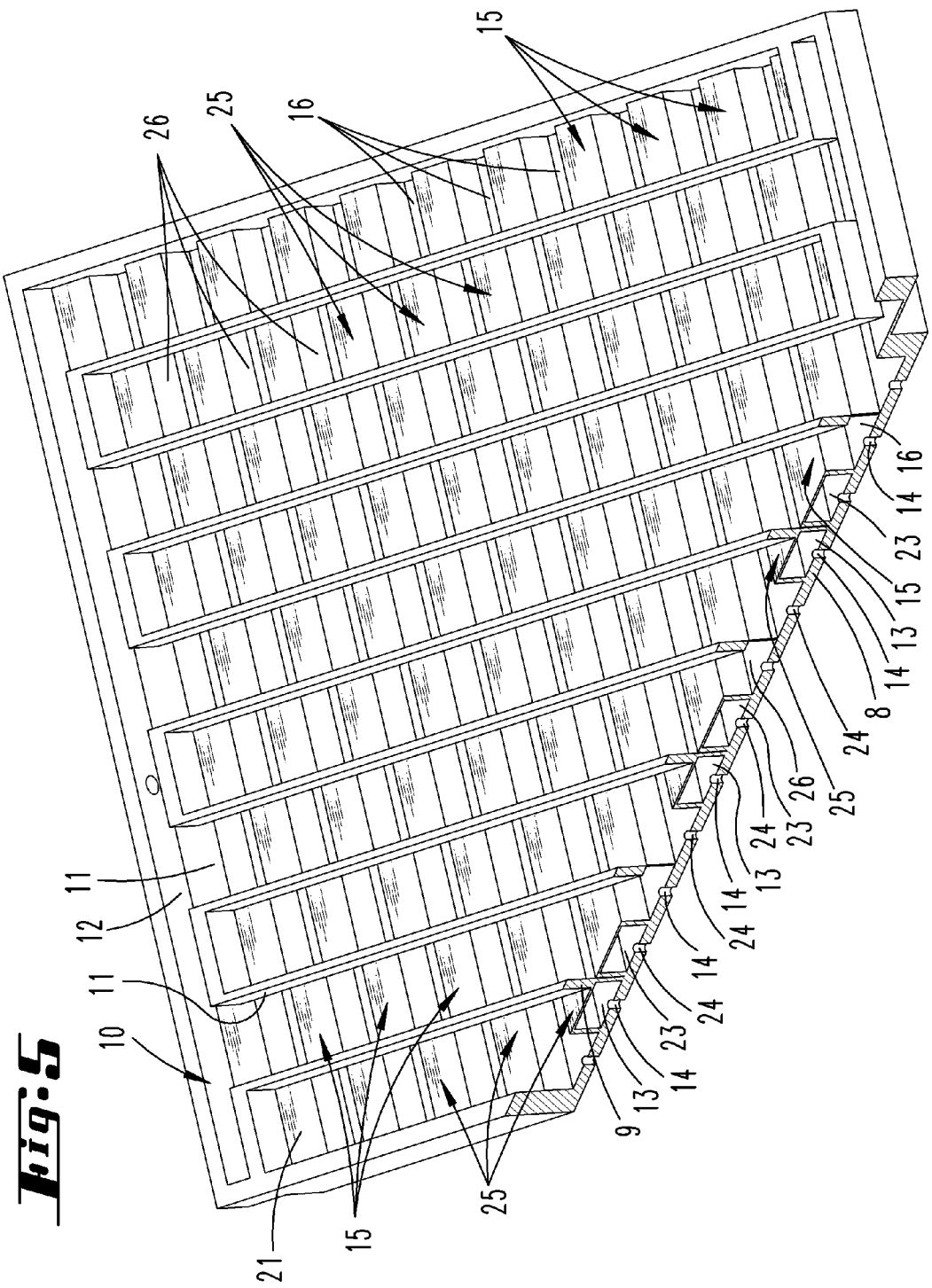

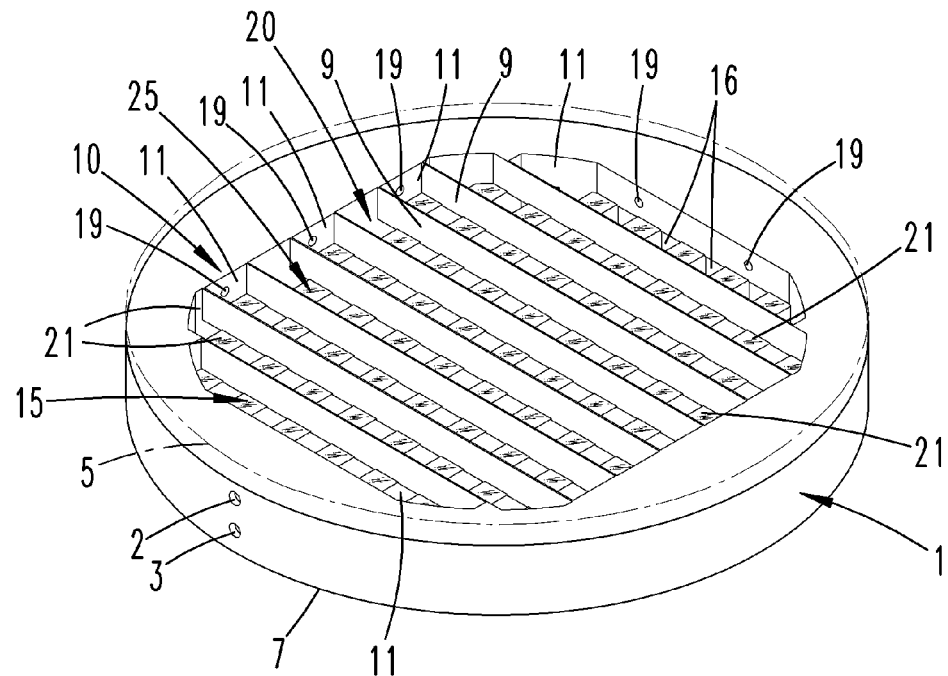
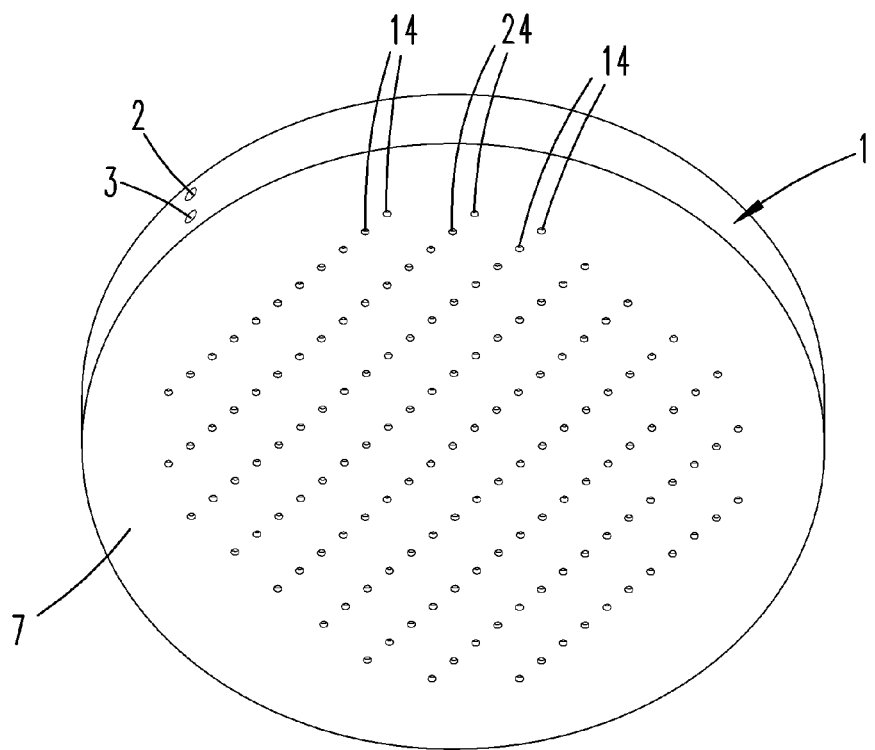

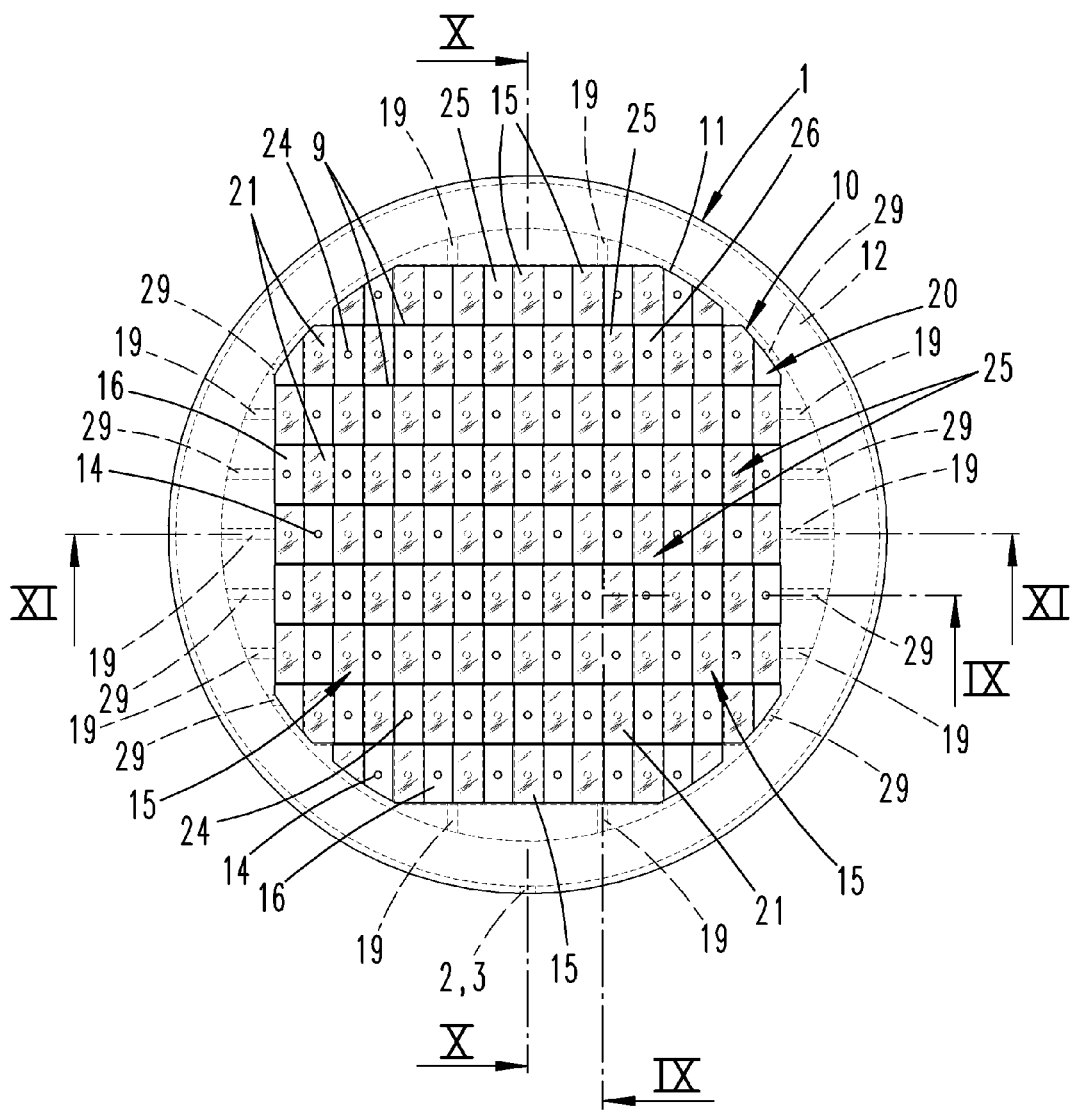

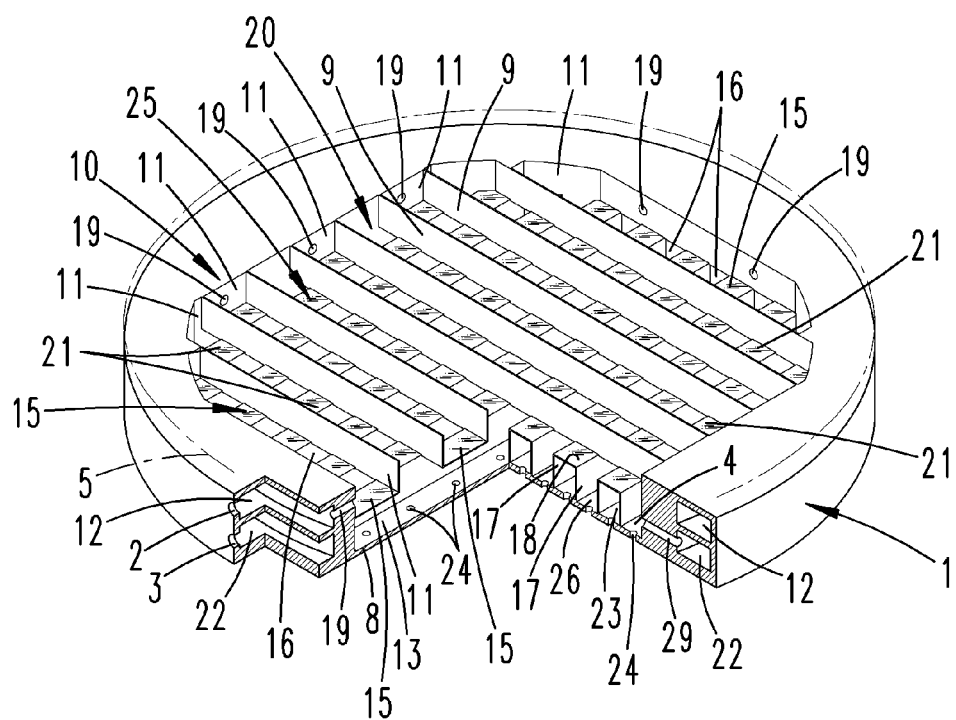

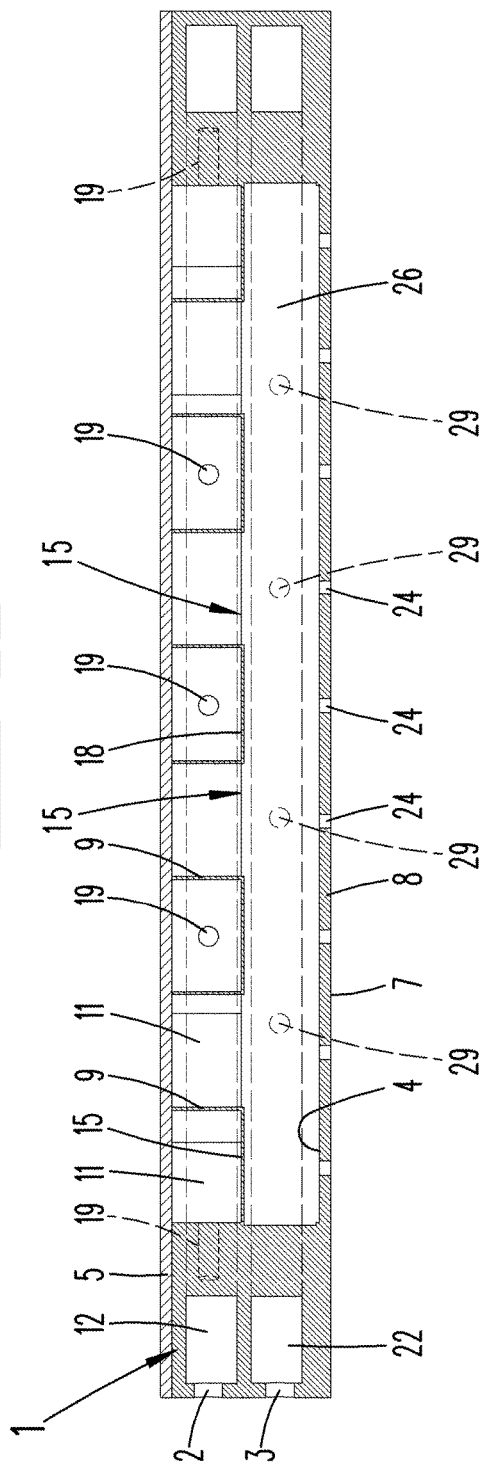

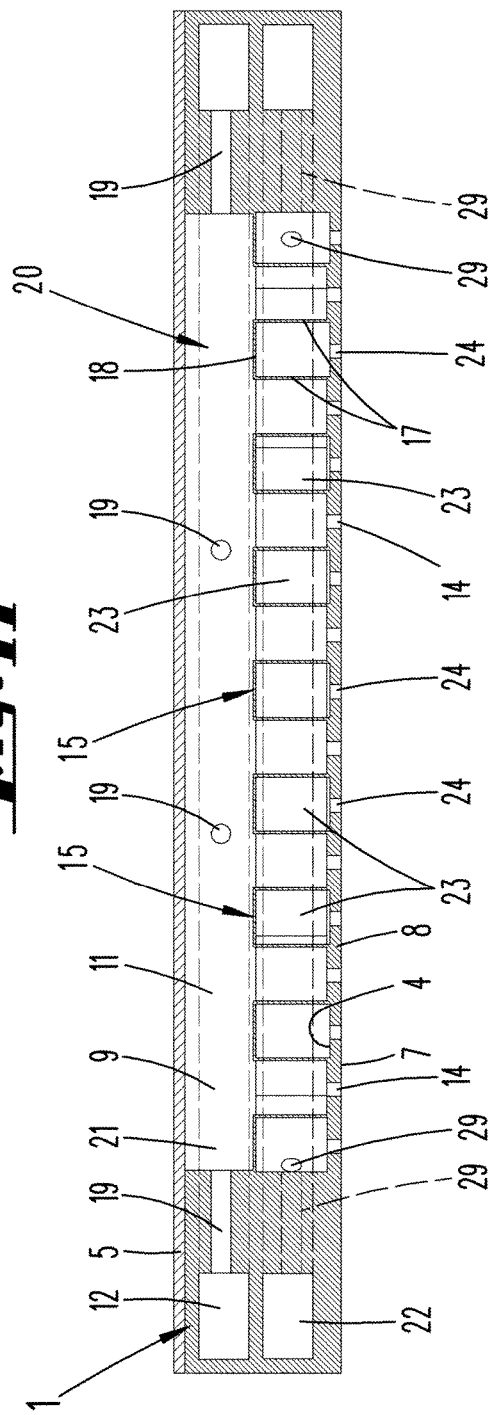

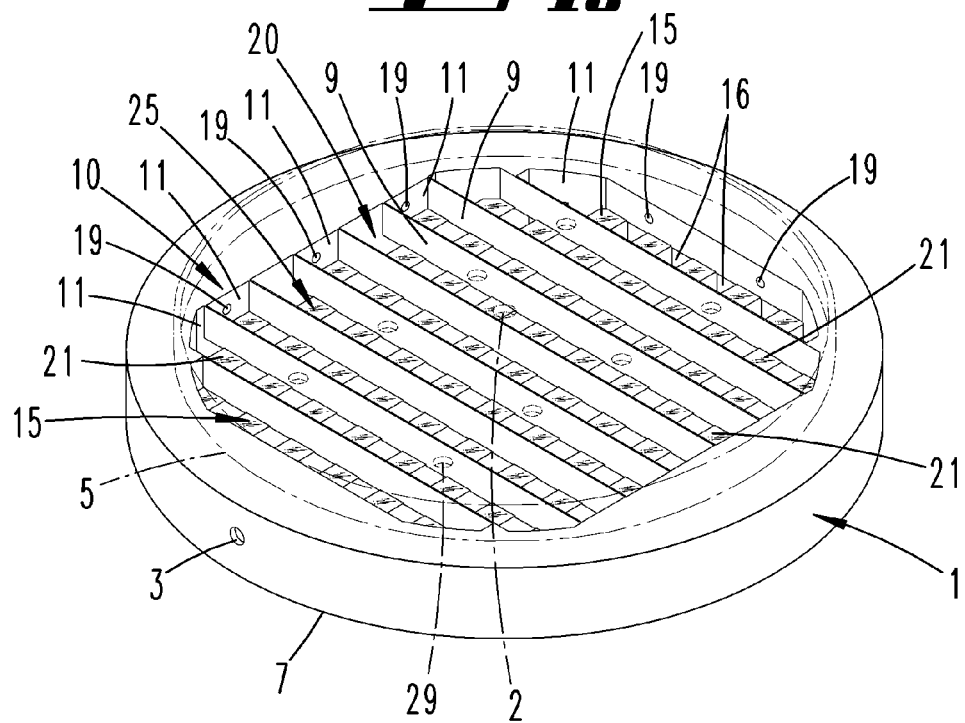
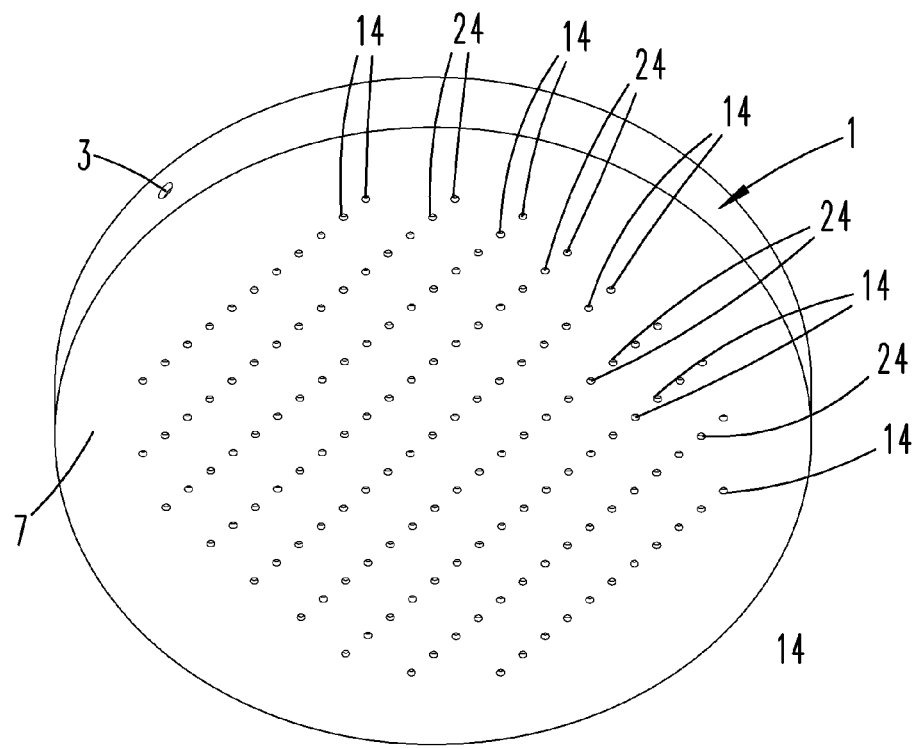

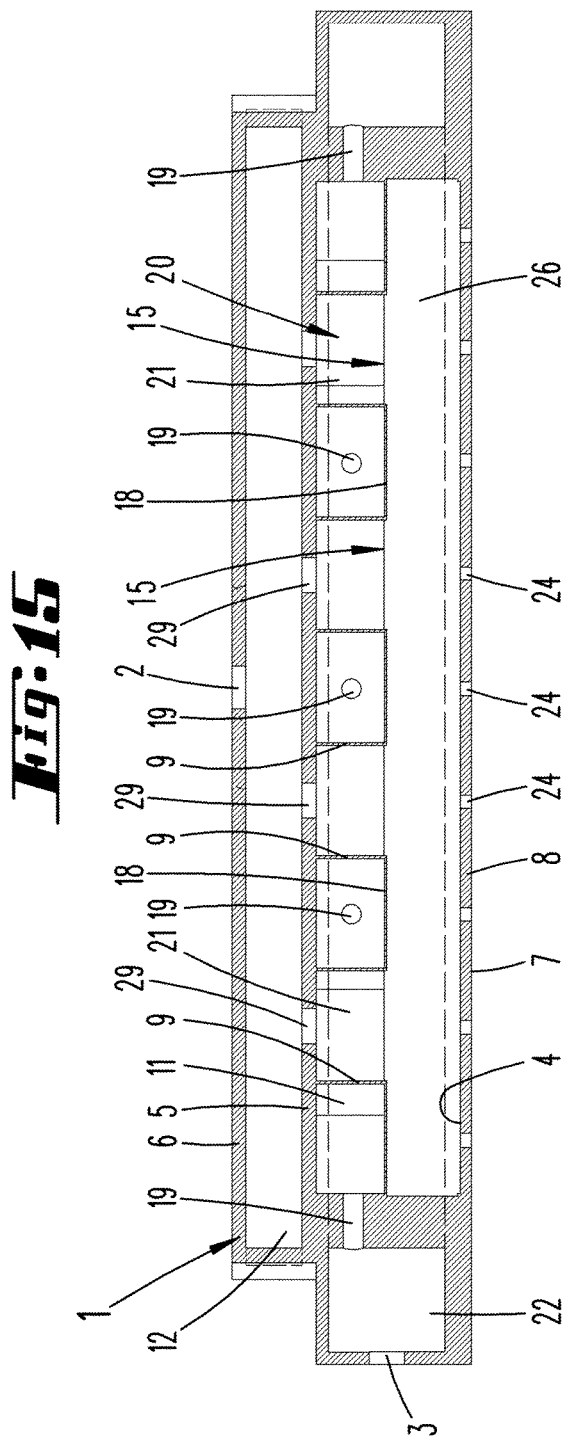

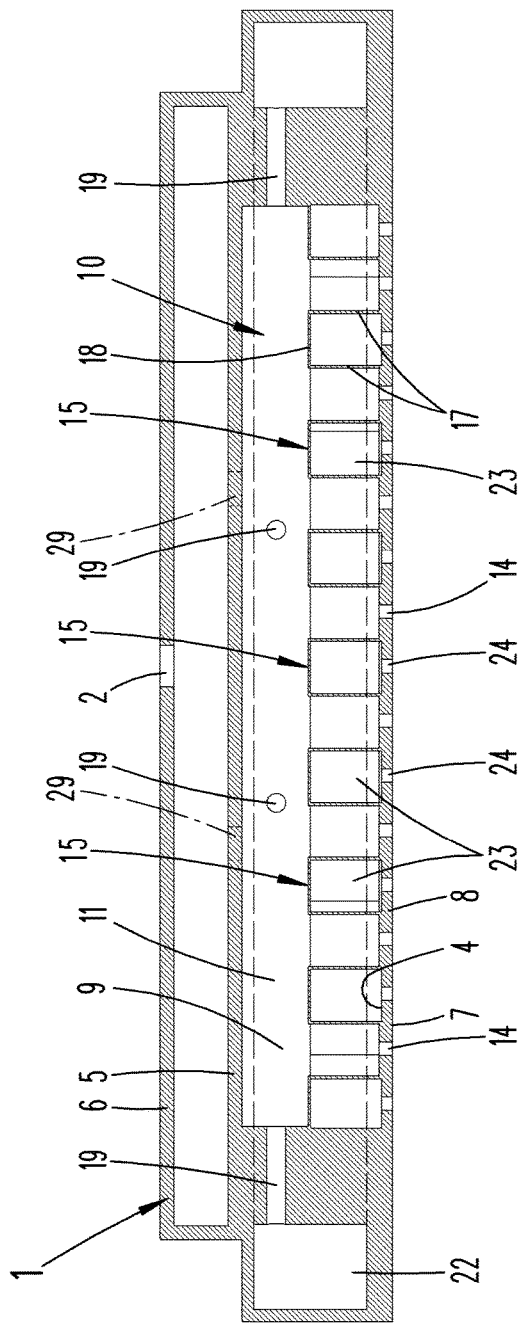

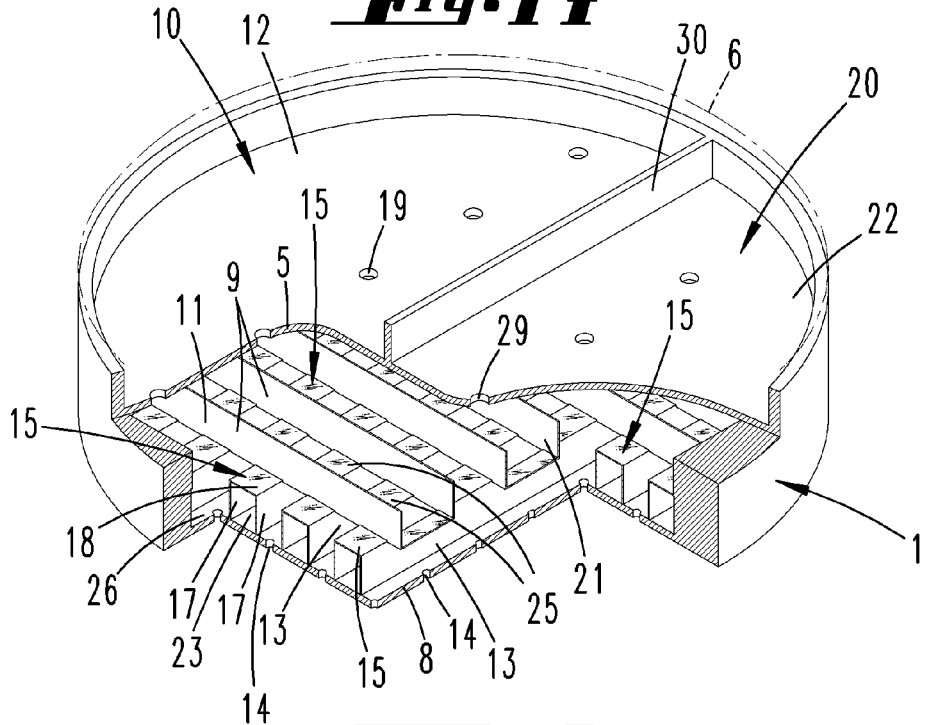
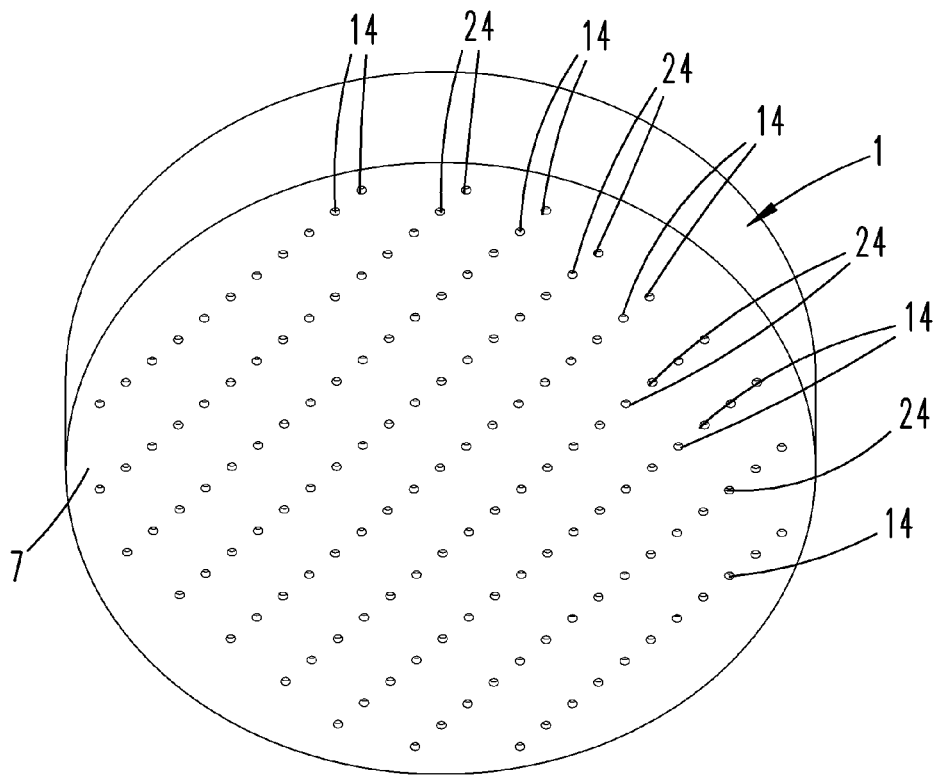

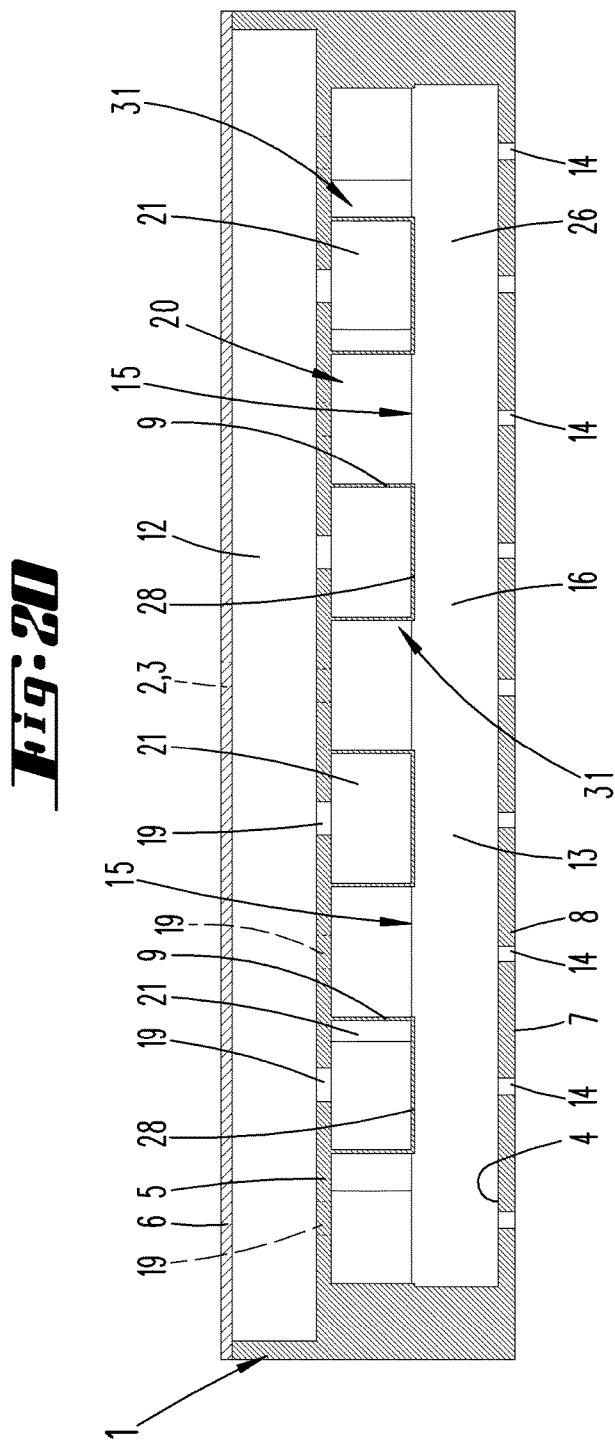

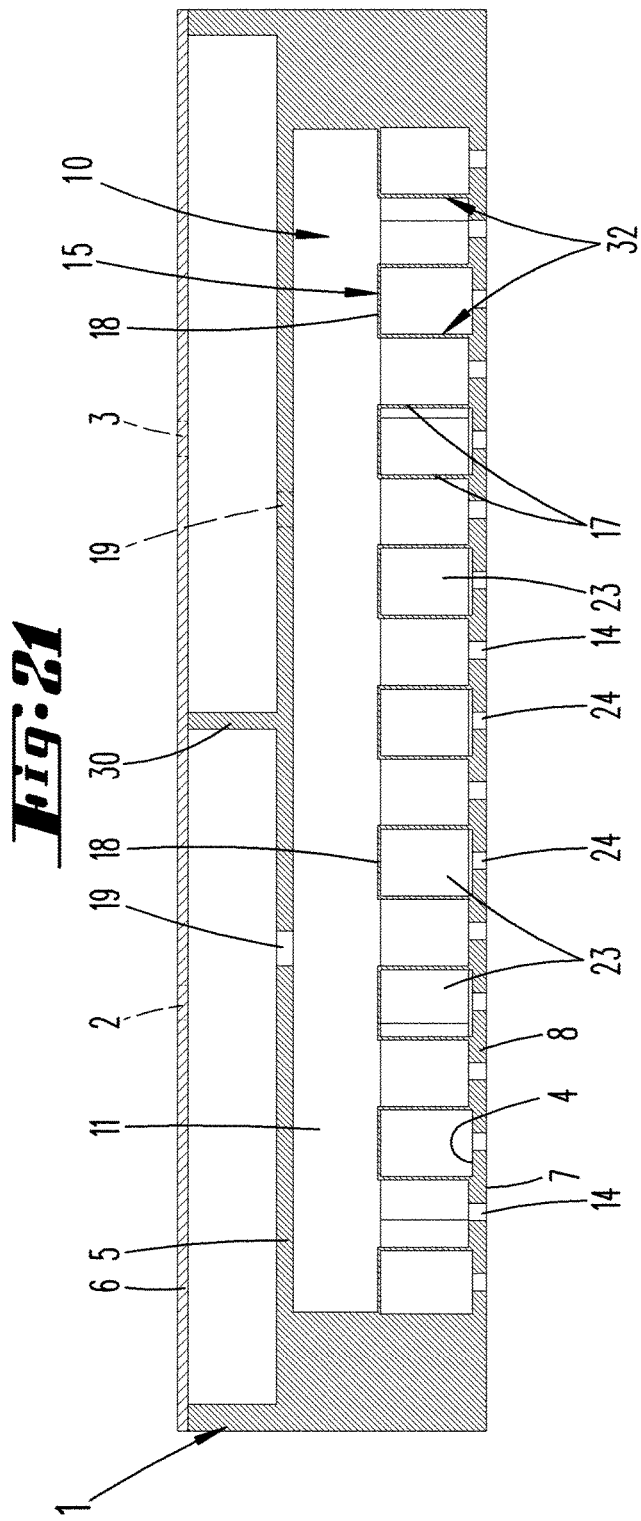

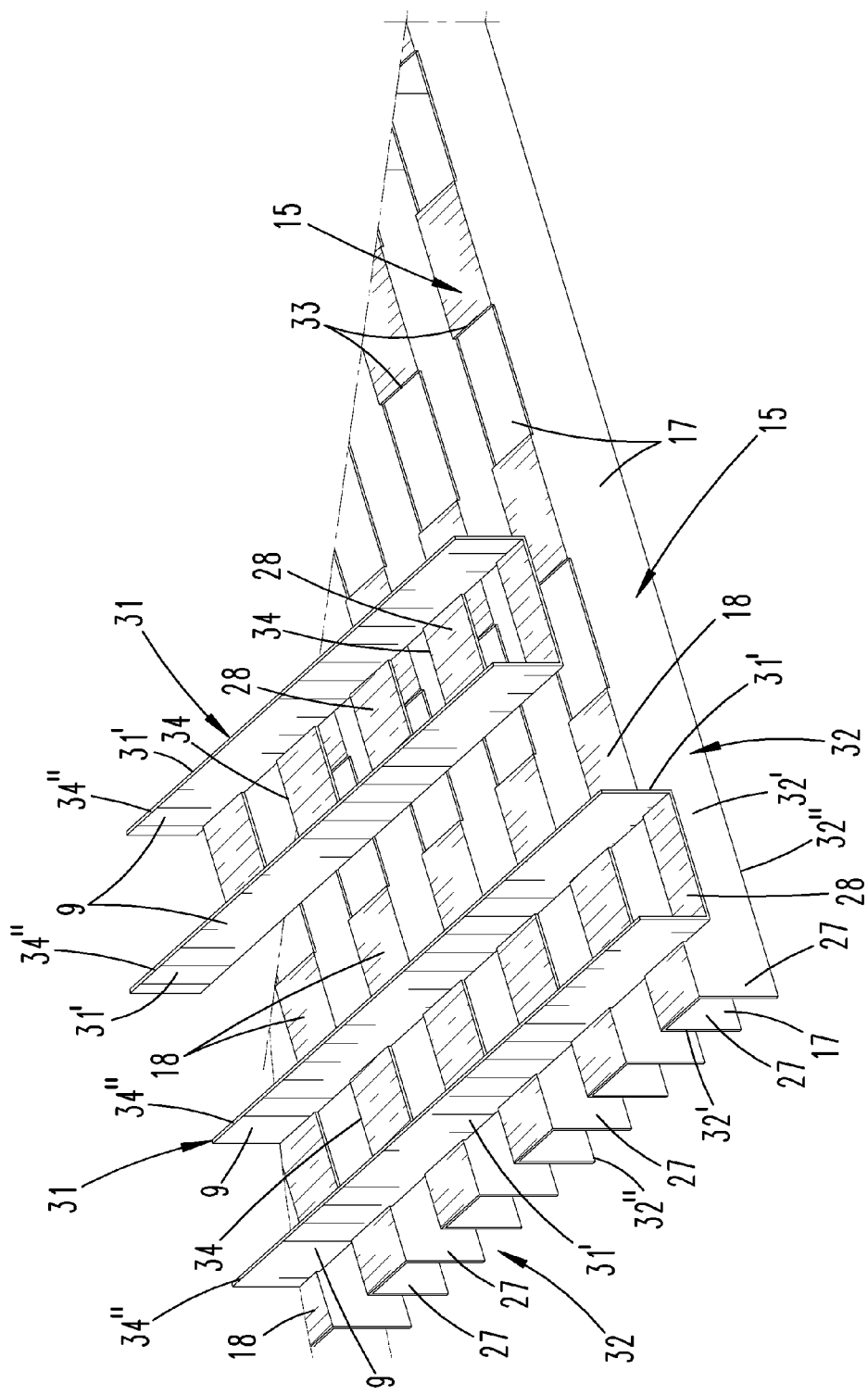

GAS DISTRIBUTOR FOR A CVD REACTOR

RELATED APPLICATIONS

This application claims priority to DE Application 10 2013 101 534.4 filed 15 Feb. 2013 which is incorporated herein by reference.

FIELD OF THE INVENTION

The invention relates to a gas distributor for a CVD reactor having at least two separate gas distribution chambers, into each of which a process gas can be fed through an infeed opening, a gas distribution device disposed in a top layer being in each case flow-connected to connecting channels disposed in a bottom layer, the connecting channels associated with different gas distribution chambers lying alternately adjacent to one another and having gas outlet openings for the process gases to escape.

BACKGROUND

A gas distributor of this kind is described by US 2003/0207032 A1. Here, different connecting channels, which flow-connect a multiplicity of gas outlet openings to one another, run parallel to one another in rows. Each connecting channel is flow-connected at an intersection to a supply channel, which forms a gas distribution device.

A gas distributor, in which only one gas distribution volume or gas distribution chamber is provided, is known from U.S. Pat. No. 6,444,042 B1. The gas distribution chamber has a multiplicity of connecting channels which run parallel to one another and each flow-connect a multiplicity of gas outlet openings to one another. Each connecting channel has a multiplicity of infeed points. These points are intersections of the connecting channels with a multiplicity of gas channels running parallel to one another. Only one central channel forms an infeed channel which is connected to a gas line.

US 2005/0109280 A1 describes a gas distributor with three gas infeed zones which are disposed adjacent to one another and are each fed with gas at a plurality of different points.

DE 10 2009 000 903 A1 describes a gas distributor with supply channels which mesh with one another like the teeth of a comb.

A gas inlet element for a CVD reactor is known from DE 10 2005 004 312 A1. Two gas distribution chambers, which are fed with process gases by means of different feed lines, are located in a common layer. The gas distribution chambers form chamber sections which mesh with one another in a comb-like manner. The gas distribution chambers are connected to connecting channels by means of flow connections which run vertically downwards. The connecting channels run concentrically about an axis of the gas inlet element and are connected to gas outlet openings by means of downwardly aligned gas connecting lines. The connecting channels of different gas distribution chambers are located on different layers. The disclosed gas inlet element has a plurality of gas distribution volumes, each gas distribution volume having a gas distribution chamber, connecting channels connected to said gas distribution chamber, and gas outlet openings connected to said connecting channels.

A gas distributor for a CVD reactor is also described in DE 10 2005 043 840 A1. Here, the chamber sections which are fed with different process gases alternate with one another.

SUMMARY OF THE INVENTION

It is an object of the invention to improve the gas distribution device in a gas distributor of the generic kind.

The object is achieved by the invention specified in the claims.

First and foremost, it is proposed that each of the at least two gas distribution devices has a distribution section and a multiplicity of sub-distribution sections, each sub-distribution section being flow-connected to the distribution section. The connecting channels are therefore flow-connected to a plurality of sub-distribution sections at different points in each case, preferably at intersections. The gas outlet openings are therefore supplied with gas from two sides within the connecting channel. The sub-distribution sections form channels which run alternately adjacent to one another and in each case supply the adjacent connecting channels with process gases at intersections. The sub-distribution sections therefore form supply channels which run perpendicular to the connecting channels and into which in turn process gases are fed from the distribution sections. The connecting channels can be formed from tunnel elements, which have a substantially inverted U-shaped cross section. The tunnel elements can be connected directly to the gas outlet plate, which has a multiplicity of gas outlet openings over its whole surface. Gas outlet openings of the gas outlet plate are located in the tunnel cavity of the tunnel elements, which in each case forms a connecting channel. Each gas distribution volume therefore has a gas distribution chamber which is divided into a plurality of sub-distribution sections, the individual sub-distribution sections being in turn connected to connecting channels which are formed by the cavities of tunnel elements. A preferred configuration of a gas distributor therefore has at least two separate gas distribution volumes. Each of the two gas distribution volumes is flow-connected from the outside to a gas supply line system by means of an infeed opening, so that a process gas, for example a reactive gas transported in a carrier gas, can be fed into the gas distribution volume through the infeed opening. A distribution section, which is a sub-volume of the gas distribution volume, is connected to the infeed opening in the flow direction. The above-mentioned sub-distribution sections, which are in turn fed from the distribution section, are connected to the distribution section in the flow direction. The distribution sections, thus, the sub-distribution volumes, are in turn connected to the tunnel cavities of the tunnel elements, it being preferred that a tunnel element in each case forms only one section of a connecting channel which in each case connects only two sub-distribution sections to one another. The connecting channels, thus, the cavities of the tunnel elements, are part of one gas distribution volume, while the area surrounding the tunnel walls is part of a different gas distribution volume. Gas outlet openings are likewise located outside the tunnel, in particular adjacent to the tunnel walls. However, these are associated with a different gas distribution volume from the gas outlet openings which are located in the intermediate tunnel. A strip-like structure of gas outlet zones, through which different gases can flow into a process chamber of a CVD reactor disposed below the gas outlet plate, is therefore formed. The gas outlet plate can be rectangular in plan view. Accordingly, the gas outlet element or gas distributor has a rectangular-shaped base. However, it is also possible for the gas outlet element to be circular in plan view. The tunnel elements can then run on circular arc sections. However, they can also run in a radial direction. The same applies to sub-distribution sections which run perpendicular to the direction of the tunnel extent and which can run parallel to one another or on circular arc lines or on radial lines. The dividing walls preferably extend in a layer which lies above the layer of the tunnel elements. The tunnel elements are located in the layer which lies below the layer which has the dividing walls. Preferably, only tunnel elements lie in this layer. The layer is bounded at the bottom by the gas outlet plate. In the layer above the tunnel elements, the sub-distribution sections extend substantially adjacent to one another. The tunnel elements extend perpendicular to the direction of extension of the sub-distribution sections. The distance between two tunnel elements in the direction of extent of a sub-distribution section is approximately equal to the width of a tunnel section. The distance between two tunnel elements perpendicular thereto is approximately equal to the width of a sub-distribution section. In this respect, gas outlet zones for different gases alternate in the direction of extent of the sub-distribution sections. On the other hand, the gas outlet zones run continuously in the direction of extent of the tunnel. The reason for this is that the end faces of two tunnel elements which are part of the same gas distribution volume are in line with one another, whereas sections of a different gas distribution volume lie between the walls of two tunnel elements which are part of the same gas distribution volume. The dividing walls can be formed by a single dividing wall element which has a meandering course, thus, has sections which run parallel to one another. A comb-like structure of each gas distribution chamber is therefore formed, the individual parallel-running sub-distribution sections being fed by distribution sections. The distribution sections are spaced apart from one another. With a rectangular gas distributor, the distribution sections lie opposite one another. The device according to the invention can therefore be produced in that a meandering dividing wall element is produced first and connected to a multiplicity of inverted U-shaped tunnel elements, the tunnel head surfaces being in each case welded to the dividing wall in the region of the face opening of the tunnel element. In doing so, alternately left and right-facing tunnel elements are attached to a dividing wall section, namely in such a way that the tunnel wall sections of immediately adjacent tunnel elements are connected to one another in a line. A gas outlet plate, which is provided with a multiplicity of holes, is then connected to the wall ends of the tunnel elements. This can be achieved by diffusion welding, gluing or similar means. However, it is also possible to connect the individual tunnel elements first to the gas outlet plate and subsequently to place the dividing walls on the tunnel elements, which are connected to the gas outlet plate and are arranged in the manner of a chess board.

In a refinement of the invention, the gas distributor has a circular circumference. The distribution sections of the gas volumes can encompass the gas outlet surface of the gas outlet plate in the circumferential direction. Two-ring-shaped distribution sections, which are disposed one above the other and have the inlet openings through which individual or a plurality of distribution sections of the gas volumes are fed, can be provided. The inlet openings can be arranged in different layers. In a refinement of the invention, it is provided that at least one distribution section of one of the at least two gas volumes is disposed above a sub-distribution section in which a gas distribution takes place. The sub-distribution sections form chamber sections. In a variant of the invention, it is provided that one distribution section is located in a third layer and one distribution section is formed in a circumferential channel. Two distribution sections can also be arranged in the third layer. They can be separated from one another by a dividing wall. They have inlet openings which open out into the sub-distribution sections in which a sub-distribution to the layer in which the tunnel elements are disposed takes place.

It is a further object of the invention to provide a flat gas distributor which is easier to produce compared with known gas distributors.

A gas distributor of the kind according to the invention is preferably produced in that the connecting channels are formed from substantially U-shaped and inverted U-shaped tunnel elements. The tunnel elements each have two side walls which run parallel to one another. An edge of these side walls is connected to the inside of the gas outlet plate. The inverted U-profile is formed by the two side walls and by a connecting wall which connects the two side walls to one another. This connecting wall is at a distance from the inside of the gas outlet surface. In a particularly preferred configuration of the invention, the tunnel elements are formed by intersecting profile elements. These are preferably inverted U-profile elements which have uninterrupted side walls, but whose connecting wall has windows arranged at regular intervals. The side walls are formed by the legs of the inverted U-profile elements, and the connecting wall is formed by the cross members connecting the legs. There are U-profile and inverted U-profile elements. The U-profile elements form the sub-distribution sections in which a gas sub-distribution takes place. The profile opening of the U-profile elements faces away from the gas outlet plate. The connecting wall of the U-profile elements, to which the two side walls are connected, has window-shaped openings which are disposed at the intersections of the U-profile and inverted U-profile elements. The windows of the U-profile elements are disposed above the windows of the inverted U-profile elements. The profile opening of the inverted U-profile elements faces towards the gas outlet plate so that the U profile elements lie above the inverted U-profile elements in a back-to-back manner. The intermediate spaces of the U-profile and inverted U-profile elements are connected to one another by the overlapping windows so that the intermediate spaces of the U-profile and inverted U-profile elements are associated with the same gas volume. The other gas volume is associated with the intermediate space between adjacent U-profile elements and adjacent inverted U-profile elements. The sections of the bottom wall of the U-profile element which are disposed between the windows of the U-profile elements form a connecting wall for a tunnel element. A gas distributor according to the invention can be easily produced as a result of such a configuration. Holes, which form the gas outlet openings, are drilled in rows and columns in a gas outlet plate which, for example, forms the bottom of a cup-shaped housing. U-profile and inverted U-profile elements, which have recesses or cut-outs on the backs thereof, are then produced. The inverted U-profile elements are fixed to the gas outlet plate with the inverted U-profile opening facing the gas outlet plate, which can be achieved by welding, gluing, etc. In doing so, the inverted U-profile elements lie parallel to one another and have a constant spacing from one another, which is substantially equal to the spacing between the two side walls of an inverted U-profile element. In a further method step, the U-profile elements are disposed in a second layer above the backs of the inverted U-profile elements. Their profile opening faces away from the gas outlet plate. The U-profile elements run perpendicular to the inverted U-profile elements and likewise have a constant spacing and run parallel to one another, the spacing of adjacent U-profile elements being equal to the spacing of the two side walls of one of the U-profile elements. The backs of the U-profile elements have windows which lie above the windows of the inverted U-profile elements. The upward facing edges of the side walls of the U-profile elements are connected to a cover plate which seals the entire volume of the housing.

The gas inlet element described above can not only be used in MOCVD reactors in which layers are deposited from elements of main groups III and V. The gas distributor is also suitable for use in reactors in which organic materials are deposited onto substrates, for example for the production of OLEDs. In addition, the gas distributor is also suitable for depositing polymers. A gaseous polymer carrier or initializer is fed into the gas volumes. The two gases escape from different gas outlet openings into the process chamber. The gas distribution chambers can be heated or cooled. The gas distributor has a heating or cooling system, respectively, for this purpose. The gas outlet openings can be disposed in the form of a chess board. They can be disposed in the form of lines. They can be disposed in the form of a mesh. They can also be disposed in the form of a circle however. The gas distributor can have two gas volumes. However, it can also have three or four separate gas volumes, into each of which can be fed a certain process gas or carrier gas, which can escape into a process chamber through outlet openings, which are associated with the respective gas volume.

BRIEF DESCRIPTION OF THE DRAWINGS

Exemplary embodiments of the invention are explained below with reference to accompanying drawings. In the drawings:

FIG. 1 shows a gas distributor of a first exemplary embodiment in the form of a gas inlet element for a CVD reactor with cover plate removed, FIG. 2 shows a perspective bottom view of the gas distributor, FIG. 3 shows a plan view on the gas distributor with cover plate removed, FIG. 5 shows an illustration according to FIG. 4, but with a different cut-away line, FIG. 6 shows a perspective illustration of a second exemplary embodiment of a gas distributor with cover not shown, FIG. 7 shows a bottom view of the gas distributor shown in FIG. 6, FIG. 8 shows a plan view on the interior of the gas distributor according to FIG. 6, FIG. 9 shows a perspective illustration of the gas distributor shown in FIG. 6 with a cut-away, FIG. 10 shows the section according to Line X-X in FIG. 8, FIG. 11 shows the section according to Line XI-XI in FIG. 8, FIG. 12 shows a third exemplary embodiment of the invention in a perspective illustration with housing cover removed, FIG. 13 shows a bottom view of the gas distributor shown in FIG. 12, FIG. 15 shows a section according to Line XV-XV in FIG. 14, FIG. 16 shows a section according to Line XVI-XVI in FIG. 14, FIG. 17 shows, partially cut away, a perspective illustration of a fourth exemplary embodiment of a gas distributor, FIG. 18 shows the bottom view of the exemplary embodiment shown in FIG. 17, FIG. 20 shows a section according to Line XX-XX in FIG. 19, FIG. 21 shows a section according to Line XXI-XXI in FIG. 19, and FIG. 22 shows the perspective diagram of U-profile elements 31 and inverted U-profile elements 32, with which a tunnel element arrangement 15, 25 can be produced when intersecting first profile elements 31 and second profile elements 32 are laid back-to-back on top of one another.

DETAILED DESCRIPTION

Figure 4:
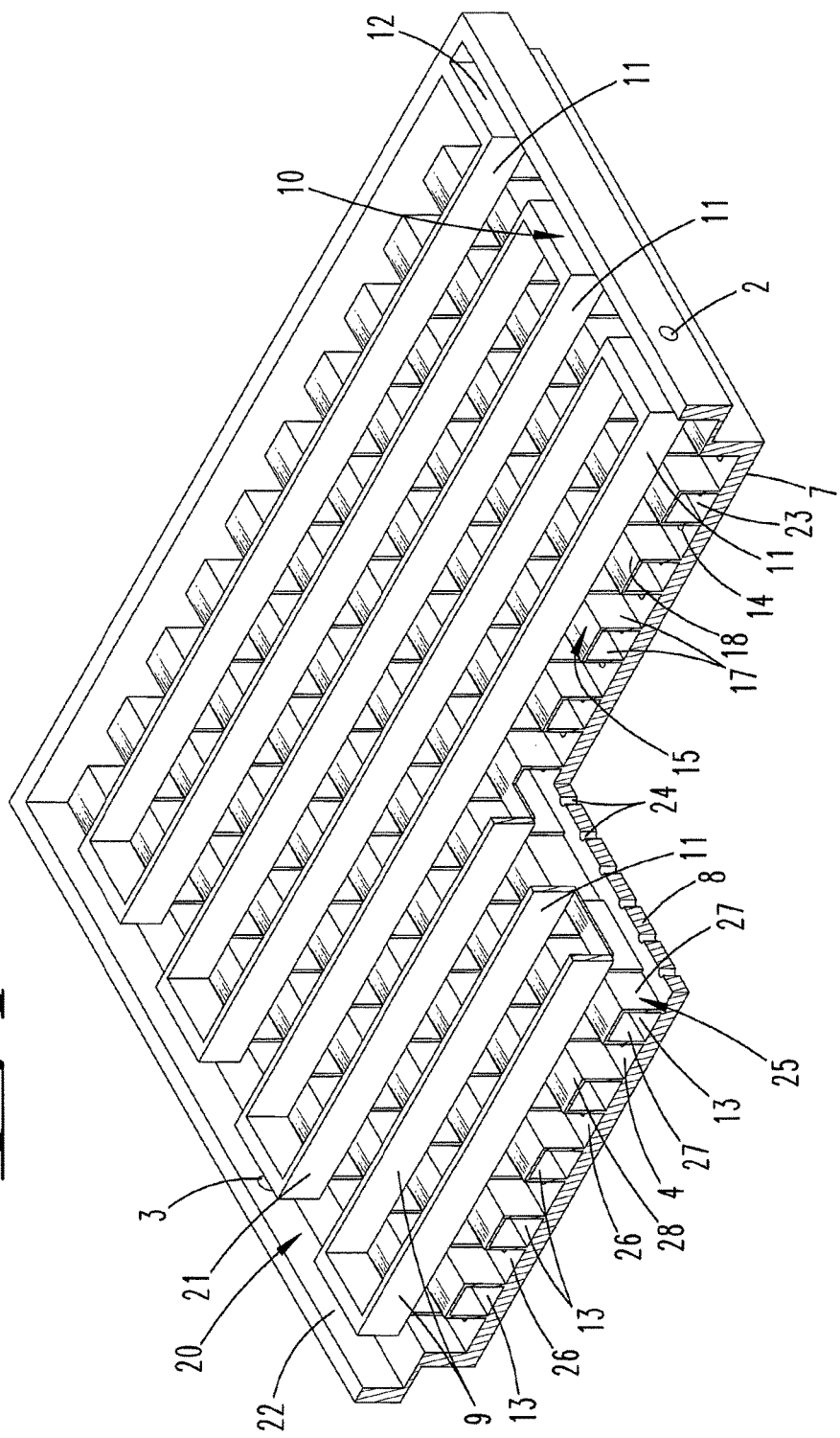
FIG. 4 shows a further perspective illustration according to FIG. 1 with cover plate removed and partially cut away.

In each case, the drawings show a gas distributor as is used in a CVD reactor. The gas distributor has a rectangular housing which is formed by four side walls, a cover plate (not shown) and a base plate. The base plate is a gas outlet plate 8 having a gas outlet surface 7 into which a multiplicity of gas outlet openings 14, 24 open out.

The housing 1 is made of metal, in particular steel, and has infeed openings 2, 3, through which the process gases can be fed into separate gas distribution volumes. The gas outlet surface 7 has gas outlet openings 14, 24 which are disposed in a row-like manner and which are associated row-by-row in each case with different gas volumes.

The interior of the housing 1 is structured into two adjacent layers. A bottom layer borders on the gas outlet plate 8. A layer above it borders on the cover plate, which is not shown. In the exemplary embodiment shown in FIGS. 1 to 5, the infeed openings 2, 3 open out into the top layer and are disposed on broad sides of the housing 1 which face away from one another.

The top layer of the housing 1 is divided into two gas distribution chambers 10, 20 by means of a dividing wall 9 which has a meandering course. Each of the two distribution chambers 10, 20 is associated with one of the two gas distribution volumes. The dividing wall 9 structures the top layer in such a way that sub-distribution sections 11, 21, which extend substantially over the whole length of the housing 1, branch off from two opposing distribution sections 12, 22 like the teeth of a comb. As a result of the meandering course of the dividing wall 9, sub-distribution sections 11, 21, which are part of different gas distribution volumes, lie alternately adjacent to one another. The sub-distribution sections 11, 21 of different gas distribution volumes therefore lie alternately adjacent to one another perpendicular to the direction of their longitudinal extension. The sub-distribution sections 11, 21 form supply channels which run adjacent to one another and which in each case are fed individually by the distribution sections 12, 22.

A multiplicity of tunnel elements 15, 25 are arranged in the bottom layer. The tunnel elements 15, 25 extend perpendicular to the direction of extension of the sub-distribution sections 11, 21. The cavities of the tunnel elements 15, 25 form connecting channels 13, 23, by means of which two sub-distribution sections 11, which are part of the same gas distribution volume, are connected to one another. The tunnel elements 15, 25 each tunnel under a sub-distribution section 11, 21 of the other gas distribution volume in each case. The space inside a tunnel element 15, 25 is therefore part of a different gas distribution volume than the surrounding area outside the tunnel elements 15, 25. The intermediate spaces between the tunnel elements 15, 25 lie at intersections of the supply channels, which are perpendicular to and are formed by the sub-distribution sections 11, 21, with the connecting channels 13, 23, which extend perpendicular thereto. From FIG. 3, it can be seen that the tunnel elements 15, 25 are disposed in the form of a chess board. The distance between the walls of two tunnel elements 15, 25 which tunnel under the same sub-distribution section 11, 21 is approximately equal to the width of the tunnel element 15, 25. The distance between the face openings of two tunnel elements 15, 25 which are in line with one another is equal to the distance between the dividing wall sections of the dividing wall 9 which run parallel to one another and separate the two adjacent sub-distribution sections 11, 21 from one another. The dividing wall 9 runs above the end face openings of the tunnel elements 15, 25. In the exemplary embodiment, the tunnel elements 15, 25 have a rectangular cross section. The dividing wall 9 is connected to the top wall of the tunnel elements 15, 25 in a gas-tight manner. In each case, two tunnel elements 15, 25, which are flow-connected to different gas volumes or to different gas distribution volumes 10, 20, are connected to one another in the region of their cover. The connection is approximately a linear connection. Spaces 16, 26 between the tunnels, which are flanked by tunnel walls or tunnel openings respectively, are therefore formed within the bottom layer.

Gas outlet openings 14, 24 open out into the gas outlet surface 7 from the tunnel cavity. Gas outlet openings 14, 24 likewise open out into the gas outlet surface 7 from the spaces 16, 26 between the tunnels.

Two separate gas distribution volumes are formed as a result of the arrangement of the tunnel elements 15, 25 and the sub-distribution sections 11, 21 of the two different gas distribution chambers 10, 20 described above. Referring to FIG. 3, the lowest row of gas outlet openings—in the illustration there—is associated with the first gas distribution volume, of which the gas distribution chamber 10 is part. This forms the distribution section 12 in the top layer, from which the sub-distribution sections 11 emanate. The gas sub-distribution sections 11 are flow-connected in a downward direction to the spaces between the tunnels of the first row—referring to the illustration—of gas outlet openings 14 counting from the bottom and to every second row. The gas outlet openings 14 which lie between the spaces 16 between the tunnels are fed from the tunnel cavities 13. At the same time, gas passes through both end face openings of the tunnel elements 25 into the tunnel cavity 13.

The second gas distribution volume, of which the gas distribution chamber 20 is part, is fed from above—referring to the illustration according to FIG. 3. The distribution section 22, which—referring to the diagram—is disposed at the top, feeds the sub-distribution sections 21 which are located between the sub-distribution sections 11. Counting from the top row—referring to the diagram—of gas outlet openings 24, every second row of gas outlet openings 24 is part of the second gas distribution volume. Here too, the spaces 26 between the tunnels, which are part of the sub-distribution section 21, are likewise fed directly from the associated sub-distribution sections 21. The channels in the tunnel elements 15 which tunnel under the sub-distribution sections 11 feed the gas outlet openings 24. In the exemplary embodiment, all gas outlet openings 14, 24 of a common row are fed from the same gas distribution volume, wherein gas outlet openings which are fed from different gas distribution volumes alternate row-by-row.

The tunnel elements 15, 25 can be formed from individual elements. However, it can also be provided that U-profile elements 31 and inverted U-profile elements 32, which extend over the whole width or length of the housing 1 and form the side walls 17, 27 of tunnel elements 15 and also of tunnel elements 25, be used for this purpose. Then, however, the inverted U-profile elements 32 form only the connecting walls 18 of the tunnel element 15 in each case. The profile element has windows between these connecting walls 18. In the region of the window, two adjacent profile elements are connected to one another by means of connecting walls 28.

FIGS. 6 to 11 show a second exemplary embodiment of the invention, in which the tunnel elements 15, 25 described above are disposed in a first layer, the tunnel elements 15, 25 being inverted U-shaped structures which each have a side wall 17, 27, the peripheral edges of which are connected to the inner side 4 of the gas outlet plate 8. The side walls 17, 27 are connected to connecting walls 18, 28 to form a closed channel which, however, is open on its front ends.

Unlike in the first exemplary embodiment, the housing 1 of the second exemplary embodiment is circular in plan view. The process gases are fed from ring channels 21, 22 into the various distribution sections 11, 21, in which a sub-distribution takes place. Two ring channels 21, 22, which are disposed above one another and form gas distribution sections and are part of the separate gas volumes 10, 20, are provided. With inlet openings 19, 29 running substantially in the radial direction, the sub-distribution sections 11, 21 are fed by means of the distribution sections 12, 22. The inlet openings 19, 29 lie in separate layers. The inlet opening 19, which is part of a first gas distribution volume 10, opens out directly into a region of a sub-distribution section 11 which is separated from a sub-distribution section 21 of a second gas distribution volume by dividing walls 9 which run in straight lines. The gas is fed into the second chamber volume 20 through the inlet openings 29 which lie in the layer of the tunnel elements 15. In this exemplary embodiment, the gas outlet openings 14, 24, which are part of different gas volumes 10, 20, are also disposed alternately in rows.

From FIGS. 10 and 11, it can be seen that the gas outlet plate 8 has an inner side 4 to which tunnel elements 15, 25 which are disposed parallel to one another are fixed. The tunnel elements 15 have side walls 17, which are fixedly connected to the inner side 4 of the gas outlet plate 8 by means of their bottom edge. The side walls 17 are connected at the other end by means of a connecting wall 18 which runs parallel to the gas outlet plate 8, thus forming channels which are open on the front end. The tunnel elements 25 have corresponding side walls 27 and connecting walls 28.

The sub-distribution sections 11, 21, which are separate from parallel-running dividing walls 9 and are fed from the inlet openings 19, 29 and effect a sub-distribution of the process gases to the tunnel elements 15, 25 and directly feed the spaces between the tunnels, are located at a level above the tunnel elements 15, 25.

Figure 14:
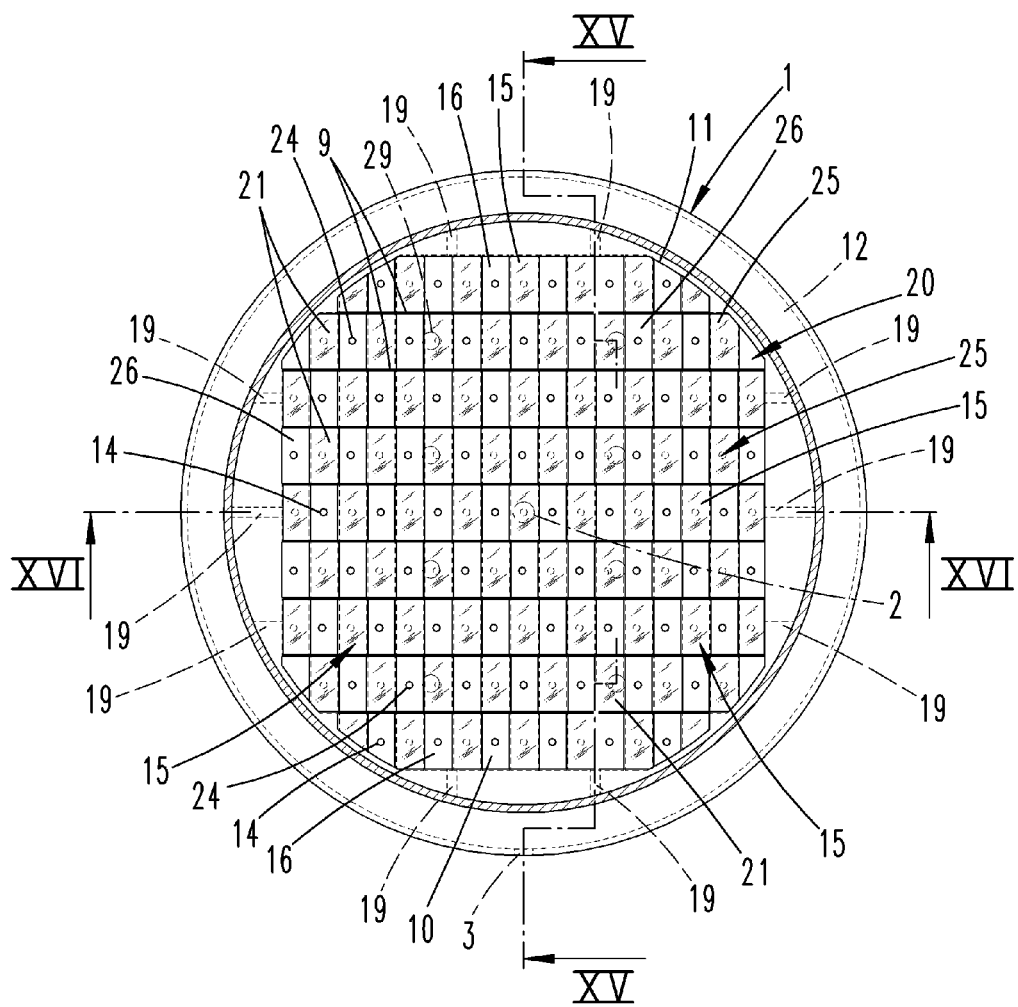
FIG. 14 shows a plan view on the interior of the housing of the gas distributor shown in FIG. 12 with cover removed.

The third exemplary embodiment, which is shown in FIGS. 12 to 16, essentially differs from the second exemplary embodiment only in that the distribution sections 12, 22 are disposed differently. A distribution section 12, which is disposed at the outer edge of the housing and encompasses the gas outlet surface 7 in the form of a ring, is associated with the first gas volume 10. A sub-distribution section 11 is fed with the process gas 10 through an inlet opening 19.

A cover 5, which bounds the sub-distribution sections 11, 21, extends parallel to the gas outlet plate 8. The cover 5 is connected to the dividing walls 9 so that connecting walls 18, dividing walls 9 and cover 5 form a closed channel, the bottom of the channel being open between the connecting walls 18, thus enabling process gas to pass into the tunnel elements 15.

A circular-disk-shaped volume, which forms the distribution section 22, is located above the cover 5. The distribution section 22 is fed with process gas through a feed opening 3 and has inlet openings 29 through which the process gas can flow out of the distribution section 22 into the sub-distribution section 21 below the cover 5, so that sub-distribution to the tunnel elements 15 is possible.

Figure 19:
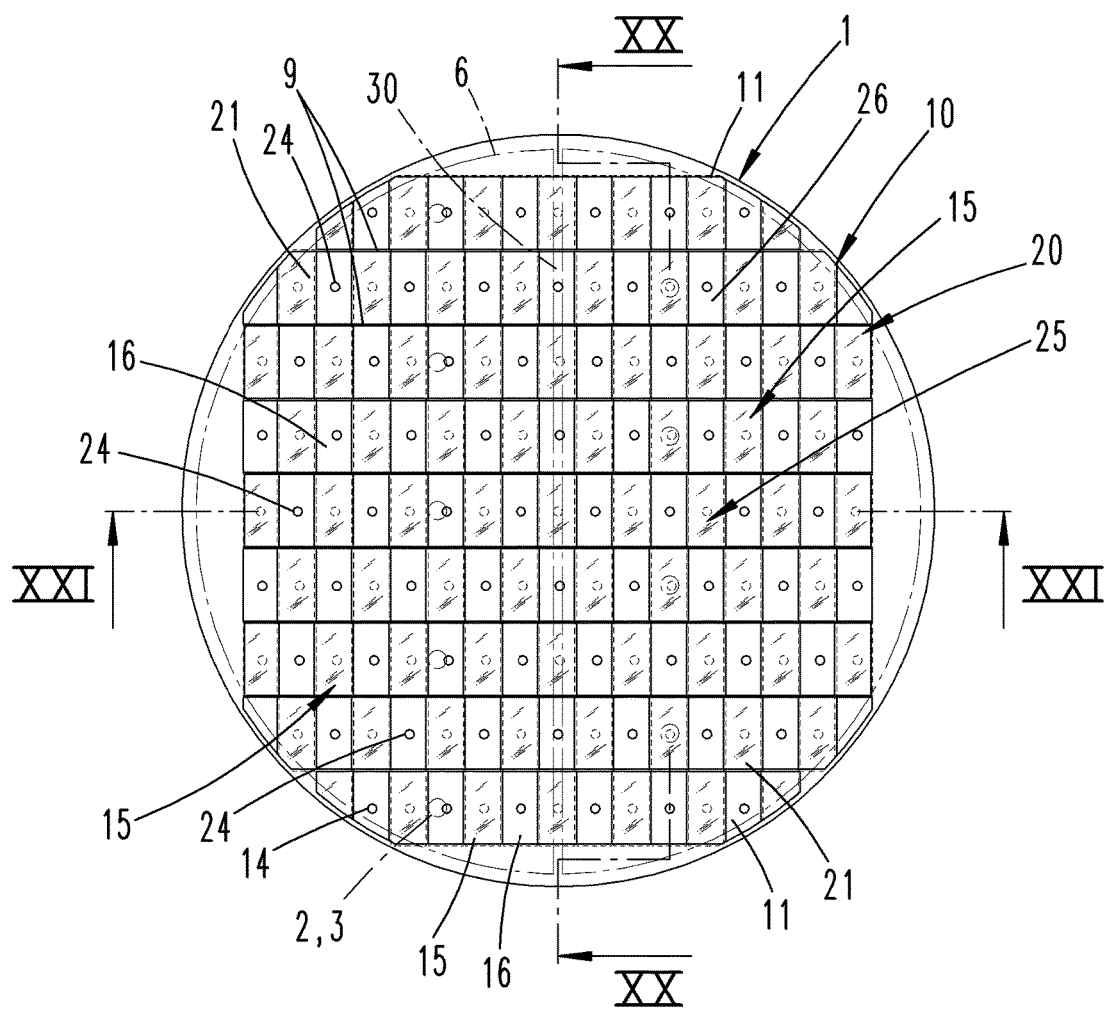
FIG. 19 shows a plan view on the interior of the housing of the exemplary embodiment shown in FIG. 17.

The fourth exemplary embodiment shown in FIGS. 17 to 22 differs from the second and third exemplary embodiments essentially only in that, in the fourth exemplary embodiment, both distribution sections 12, 22 are disposed at a third level above the distribution sections 11, 21. Two semicircular distribution sections 12, 22, which are bounded from above by a cover 6 and from below by the cover 5, are formed. The cover 5 has inlet openings 19, 29 which are each connected to sub-distribution sections 11, 21. Here too, the sub-distribution sections 11, 21 extend parallel and adjacent to one another and are separated from one another by dividing walls 9.

FIG. 22 provides a suggestion as to how the tunnel elements 15, 25 can be manufactured. A first profile element 31, which can be made of metal, in particular steel or aluminum, has a substantially U-shaped cross section so that side walls 31' are formed. These side walls 31' form the dividing walls 9 described above. The peripheral edges 31" of the side walls 31' are connected to the cover 5. The bottom of the U-profile element 31 forms the connecting walls 28 of tunnel elements 25. The bottom of the profile element 31 has windows 34 so that different connecting walls 28 are spaced apart from one another.

Second profile elements 32, which have an inverted U-shaped cross section and which, like the first profile element 31, also have a longitudinally extended form, are provided. While the profile openings of the first profile elements 31 face away from the gas outlet plate 8, the profile openings of the profile elements 32 face towards the gas outlet plate 8. The profile element 32 has side walls 32' which run parallel to one another and have free peripheral edges 32", by means of which the profile elements 32 are fixed to the inner side 4 of the gas outlet plate 8. The back of the second profile element 32 forms the connecting walls 18 of the tunnel elements 15. The two side walls 32' which run parallel to one another form the side walls 17 of the tunnel elements 15 in the region of the connecting walls 18.

The back of the profile element 32 has windows 33 between the individual connecting walls 18. In the region of the windows 33, the side walls 32' of the second profile element 32 form the side walls 27 of the tunnel elements 25.

While the tunnel elements 15 are already fully created by the profile elements 32, the tunnel elements 25 are only formed in that a plurality of profile elements 32, which are arranged parallel to one another, are connected to first profile elements 31, which are disposed perpendicular thereto, wherein the openings of the first profile elements 31 are matched in shape to and engage on the openings 33 of the second profile elements 32. The edges of windows 33, 34 which lie on top of one another are connected to one another. In particular, the edges are connected to one another in a gas-tight manner. A mesh-like structure is formed, similar to formed U-profile elements 31 and inverted U-profile elements 32, the backs of which, which face one another, form windows 33, 34, which are matched in shape to one another and lie on top of one another in the region of the intersection.

The profile elements 32 can also be formed from closed profiles, in particular rectangular profiles. As a result, it may not be necessary to connect plates or profiles on the base plate.

All features disclosed are (in themselves) pertinent to the invention. The disclosure content of the associated/accompanying priority documents (copy of the prior application) is also hereby included in full in the disclosure of the application, including for the purpose of incorporating features of these documents in claims of the present application. The subsidiary claims in their optional subordinated formulation characterize independent inventive refinements of the prior art, in particular to undertake divisional applications based on these claims.

LIST OF REFERENCES

1 Housing
2 Infeed opening
3 Infeed opening
7 Gas outlet surface
8 Gas outlet plate
9 Dividing wall
10 Gas distribution volume, gas distribution chamber
11 Sub-distribution section
12 Distribution section
13 Connecting channel
14 Gas outlet opening
15 Tunnel element
16 Space between tunnels
17 Side wall
20 Gas distribution volume, gas distribution chamber
21 Sub-distribution section, ring channel
22 Distribution section, ring channel
23 Connecting channel
24 Gas outlet opening
25 Tunnel element
26 Space between tunnels
27 Side wall
28 Connecting wall
29 Inlet opening
30 Dividing wall
31 U-profile element
31' Side wall
31" Peripheral edge
32 inverted U-profile element
32' Side wall
32" Peripheral edge
33 Window
34 Window

What is claimed is:

1. A gas distributor for a chemical vapor deposition (CVD) reactor having at least a first and a second gas distribution chamber (10, 20), into each of which a process gas is fed through an infeed opening (2, 3), each of the gas distribution chambers (10, 20) formed in part by a gas distribution device disposed in a first layer being in each case flow-connected to connecting channels (13, 23) disposed in a second layer, the first layer being adjacent and parallel to the second layer, the connecting channels (13, 23) having gas outlet openings (14, 24) for the process gases to escape, the gas distributor characterized in that the first gas distribution chamber (10) has a first distribution section (12) located in the first layer, the second gas distribution chamber (20) has a second distribution section (22) located in the first layer, the first distribution section (12) being flow-connected to a first plurality of sub-distribution sections (11), the second distribution section (22) being flow-connected to a second plurality of sub-distribution sections (21), each of the connecting channels (13, 23) being flow-connected to either the first plurality of sub-distribution sections (11) or the second plurality of sub-distribution sections (21), ones of the first plurality of sub-distribution sections (11) and ones of the second plurality of sub-distribution sections (21) lying alternately adjacent to one another and being separated from one another by a dividing wall (9), wherein the connecting channels (13, 23) are formed by inverted U-profile tunnel elements (15, 25), wherein the first plurality of sub-distribution sections (11) and the second plurality of sub-distribution sections (21) are partially located in the first layer and extend into the second layer via spaces between adjacent ones of the inverted U-profile elements (15, 25), wherein each of the inverted U-profile tunnel elements (15, 25) comprises two planar side walls (17, 27) disposed parallel to one another and a planar connecting wall (18, 28) which connects the two planar side walls (17, 27), wherein one edge of each of the planar side walls is connected to an inner surface (4) of a gas outlet plate (8), wherein gas-outlet-plate-facing surfaces of all of the inverted U-profile tunnel elements (25) forming ones of the connecting channels (13) that are flow connected to the first gas distribution chamber (10), and gas-outlet-plate-facing surfaces of all of the inverted U-profile tunnel elements (15) forming ones of the connecting channels (23) that are flow connected to the second gas distribution chamber (20) are located within a single two-dimensional plane, and wherein the inverted U-profile tunnel elements (15, 25) are arranged in the second layer in a checkered pattern resembling a chess board.

2. The gas distributor of claim 1, wherein the first plurality of sub-distribution sections (11) and the second plurality of sub-distribution sections (21) mesh with one another like teeth of a comb.

3. The gas distributor of claim 1, wherein the dividing wall (9) exhibits a meandering profile.

4. The gas distributor of claim 1, wherein the first distribution section (12) is arranged opposite to the second distribution section (22) in the first layer.

5. The gas distributor of claim 1, wherein the dividing wall (9) is disposed adjacent to the planar connecting walls (18, 28) of the inverted U-profile tunnel elements (15, 25), and is disposed in the first layer.

6. The gas distributor of claim 1, wherein the inverted U-profile tunnel elements (25) forming portions of the first gas distribution chamber (10) and the inverted U-profile tunnel elements (15) forming portions of the second gas distribution chamber (20) are located adjacent to one another.

7. The gas distributor of claim 1, wherein the gas outlet openings (14, 24) are disposed in a gas outlet surface (7) of the gas outlet plate (8), and wherein a first row of the gas outlet openings (14) are fed by the first gas distribution chamber (10), a second row of the gas outlet openings (24) adjacent to the first row are fed by the second gas distribution chamber (20), a third row of the gas outlet openings (14) adjacent to the second row are fed by the first gas distribution chamber (10), and a fourth row of the gas outlet openings (24) adjacent to the third row are fed by the second gas distribution chamber (20).

8. The gas distributor of claim 1, wherein the infeed openings (2, 3) are disposed on a surface perpendicular to an extent of the gas outlet plate (8).

9. The gas distributor of claim 1, wherein all of the sub-distribution sections (11) of the first gas distribution chamber (10) are fluidly connected to a single contiguous distribution section (12), and wherein all of the sub-distribution sections (21) of the second gas distribution chamber (20) are fluidly connected to a single contiguous distribution section (22).

10. The gas distributor of claim 1, wherein the first plurality of sub-distribution sections (11) and the second plurality of sub-distribution sections (21) extend linearly along a first direction, wherein the connecting channels (13, 23) extend linearly along a second direction, and wherein the first direction is perpendicular to the second direction.

\* \* \* \* \*